(12) United States Patent
Chang et al.

(10) Patent No.: US 10,153,165 B1
(45) Date of Patent: Dec. 11, 2018

(54) PATTERNING METHOD

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Ming-Feng Kuo, Tainan (TW); Chien-Cheng Tsai, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/868,915

(22) Filed: Jan. 11, 2018

(30) Foreign Application Priority Data

Jul. 4, 2017 (CN) .......................... 2017 1 0537322

(51) Int. Cl.
*H01L 21/033* (2006.01)
*H01L 21/311* (2006.01)
*H01L 21/308* (2006.01)
*H01L 21/3213* (2006.01)
*H01L 21/027* (2006.01)

(52) U.S. Cl.
CPC ...... *H01L 21/0337* (2013.01); *H01L 21/0332* (2013.01); *H01L 21/31116* (2013.01); *H01L 21/0276* (2013.01); *H01L 21/3081* (2013.01); *H01L 21/3086* (2013.01); *H01L 21/32139* (2013.01)

(58) Field of Classification Search
USPC ......................................................... 438/696
See application file for complete search history.

(56) References Cited

U.S. PATENT DOCUMENTS

| | | | |
|---|---|---|---|
| 7,452,825 B2 | 11/2008 | Lee | |
| 8,247,291 B2 | 8/2012 | Min | |
| 9,117,654 B2 | 8/2015 | Lee | |
| 2013/0034963 A1* | 2/2013 | Chung | H01L 21/0337 438/700 |
| 2016/0233104 A1 | 8/2016 | Kim | |

* cited by examiner

*Primary Examiner* — Roberts P Culbert
(74) *Attorney, Agent, or Firm* — Winston Hsu

(57) ABSTRACT

The present invention pertains to a patterning method. By taking advantage of the etching loading effect due to different pattern densities in the memory cell region and the peripheral region, the first hard mask is not masked when anisotropically etching the first hard mask within the memory cell region.

10 Claims, 4 Drawing Sheets

PATTERNING METHOD

CROSS REFERENCE TO RELATED APPLICATION

This application claims the priority from CN application No. 201710537322.3, filed Jul. 4, 2017, which is included in its entirety herein by reference.

BACKGROUND OF THE INVENTION

1. Field of the Invention

The present invention relates to the technical field of semiconductor manufacturing, and more particularly to a patterning method.

2. Description of the Prior Art

The dimensions of integrated circuit (IC) features reduce as the technology continues to shrink. The integrated circuit features are traditionally patterned by lithography and etching techniques. However, the current lithography technology has reached its resolution limit.

As the integration of semiconductor elements on a chip increases, it may be difficult to form ultra-fine patterns that exceed lithographic resolution limits by lithography alone. Therefore, there is still a need in the art for an improved patterning method for forming ultra-fine patterns.

SUMMARY OF THE INVENTION

It is one object of the present invention to provide an improved patterning method that solves the deficiencies of the prior art.

According to one embodiment of the invention, a patterning method is disclosed. First, a substrate is provided, which is provided with a base layer, a first hard mask layer on the base layer, a second hard mask layer, and a mandrel-forming layer on the second hard mask layer. A photolithographic process and an etching process are performed to pattern the mandrel-forming layer into a plurality of mandrels on the second hard mask layer in a cell array region with a first pitch. The mandrel-forming layer is removed from a peripheral region. A spacer material layer is deposited on the mandrels in the cell array region and on the second hard mask layer in the peripheral region. Then, the spacer material layer is anisotropically etched to form a plurality of spacers on sidewalls of the mandrels. The mandrels are then removed, leaving the spacers in the cell array region with a second pitch. Using the spacers as an etching mask, the second hard mask layer in the cell array region and the second hard mask layer in the peripheral region are anisotropically etched, so that a patterned second hard mask layer is formed in the cell array region. Then, using the patterned second hard mask layer as an etching hard mask, the first hard mask layer in the cell array region and the first hard mask in the peripheral region are anisotropically etched, thus forming a patterned first hard mask layer in the cell array region. By taking advantage of the etching loading effect due to different pattern densities in the memory cell region and the peripheral region, the first hard mask is not masked when anisotropically etching the first hard mask within the memory cell region.

These and other objectives of the present invention will no doubt become obvious to those of ordinary skill in the art after reading the following detailed description of the preferred embodiment that is illustrated in the various figures and drawings.

DETAILED DESCRIPTION

In the following, the details will be described with reference to the drawings, the contents of which also form part of the description of the specification and are illustrated in the specific examples in which the embodiment can be practiced. The following examples have described sufficient details to enable those of ordinary skill in the art to practice this invention.

Of course, other embodiments may be adopted, or any structural, logical, and electrical changes may be made without departing from the embodiments described herein. Therefore, the following detailed description is not to be taken in a limiting sense, and the examples contained therein are to be defined by the appended claims.

Figure 1:
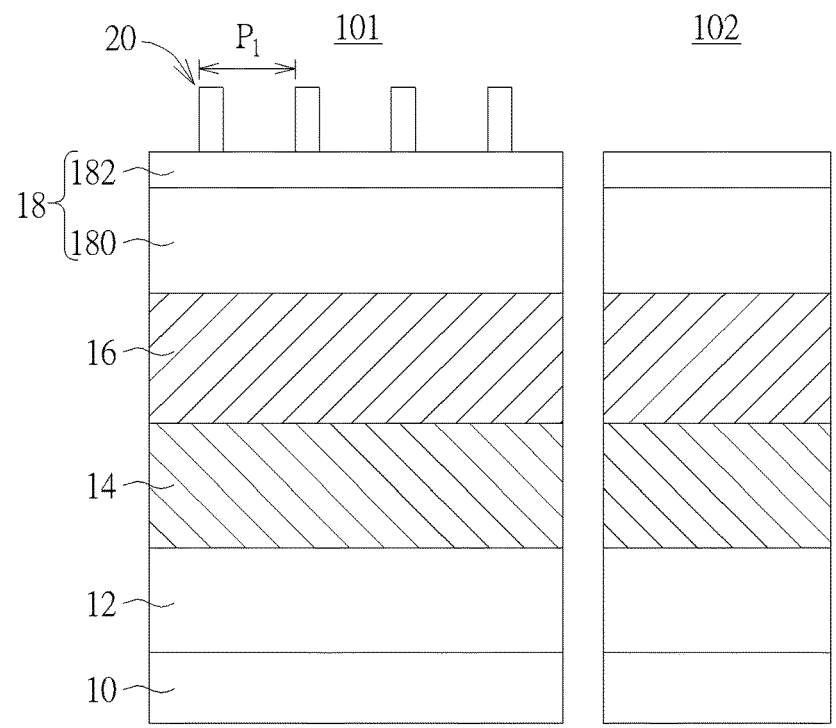
FIG. 1 to FIG. 7 show a patterning method according to an embodiment of the present invention.

Please refer to FIG. 1 to FIG. 7, which illustrate a patterning method according to an embodiment of the present invention. As shown in FIG. 1, firstly, a substrate 10 is provided with a base layer 12, a first hard mask layer 14 on the base layer 12, a second hard mask layer 16, and a mandrel-forming layer 18 on the second hard mask layer 16.

According to an embodiment of the present invention, the substrate 10 may include a silicon substrate, but not limited thereto. According to an embodiment of the present invention, the base layer 12 may include polysilicon. According to an embodiment of the present invention, the first hard mask layer 14 may include silicon nitride and the second hard mask layer 16 may include polysilicon. According to another embodiment of the present invention, the first hard mask layer 14 may include silicon carbonitride (SiCN) and the second hard mask layer 16 may include amorphous silicon.

According to an embodiment of the present invention, the mandrel-forming layer 18 may include an organic dielectric layer 180 and an anti-reflection layer 182 disposed on the organic dielectric layer 180. According to an embodiment of the present invention, the anti-reflection layer 182 may include silicon oxynitride (SiON), but not limited thereto.

Next, a lithography process is performed to form a photoresist pattern 20 in a cell array region 101. The photoresist pattern 20 has a first pitch $P_1$. In the peripheral region 102, the photoresist pattern 20 is not formed, so that the mandrel-forming layer 18 is exposed.

Figure 2:
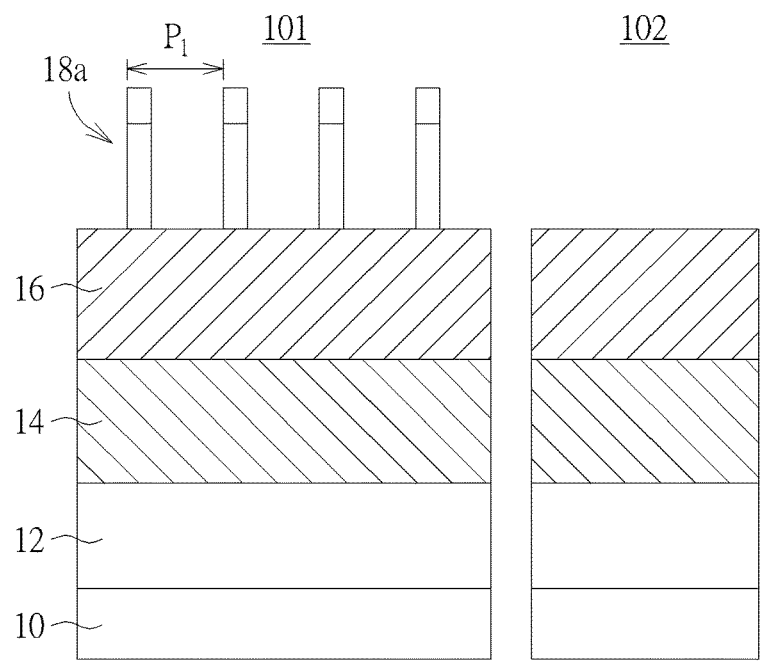

Next, as shown in FIG. 2, an anisotropic dry etching process is performed using the photoresist pattern 20 as an etching mask to etch the mandrel-forming layer 18 that is not covered by the photoresist pattern 20, so that the mandrel-forming layer 18 is patterned into a plurality of mandrels 18a, also having the first pitch $P_1$. In the peripheral area 102, the mandrel-forming layer 18 is completely removed to reveal the second hard mask layer 16.

Figure 3:
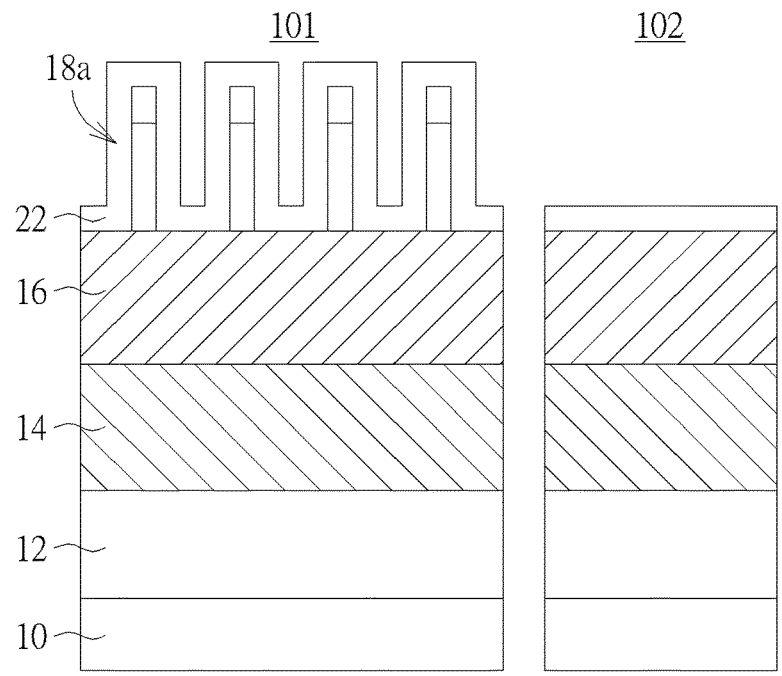

Next, as shown in FIG. 3, a spacer material layer 22 is conformally deposited on the plurality of mandrels 18a in the cell array region 101 and on the second hard mask layer 16 in the peripheral region 102. According to an embodiment of the present invention, the spacer material layer 22 may include silicon nitride or silicon oxide, but is not limited thereto.

Figure 4:
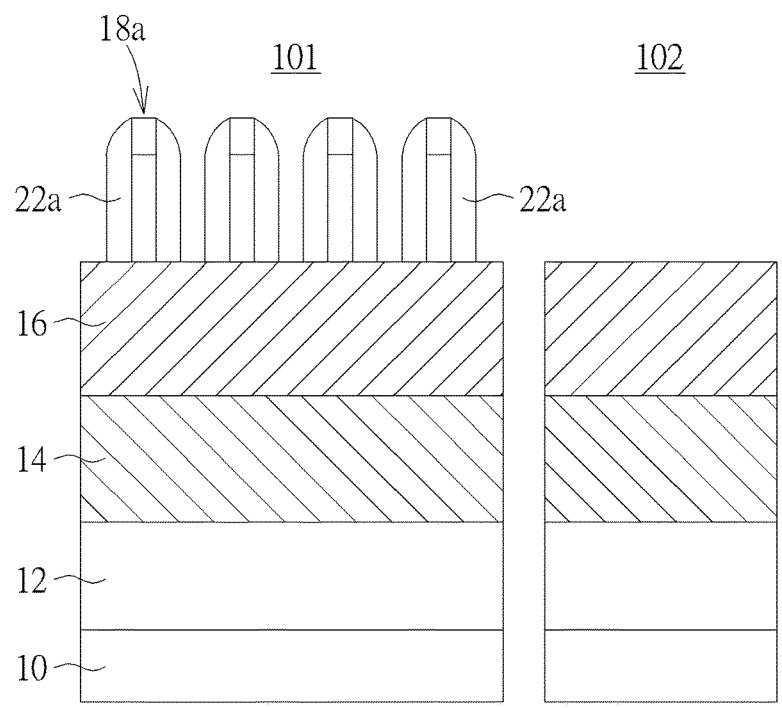

As shown in FIG. 4, the spacer material layer 22 is anisotropically etched so that spacers 22a are formed on sidewalls of the mandrels 18a, respectively. For example, the step of anisotropically etching the spacer material layer 22 may utilize an etching gas containing $CF_4$, $CHF_3$, $C_4F_8$, $C_4F_6$, or the like.

Figure 5:
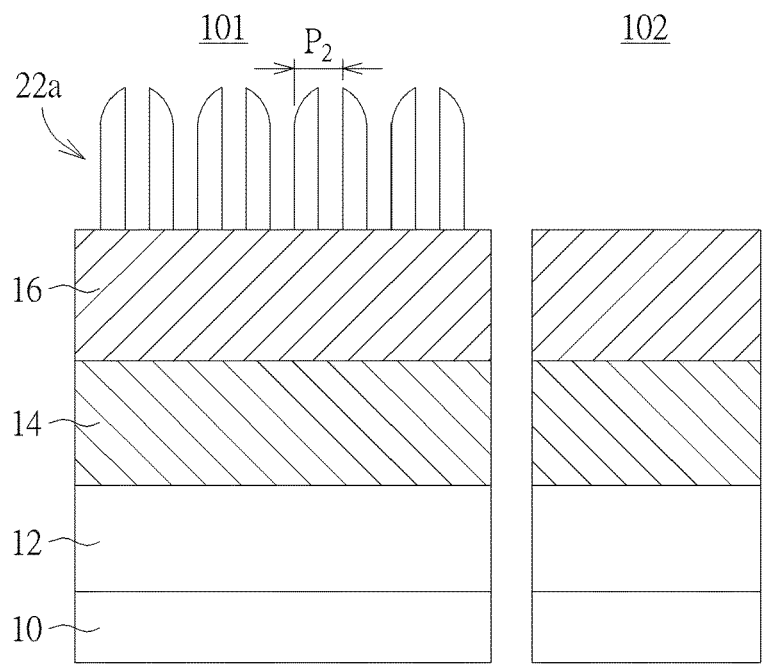

As shown in FIG. 5, the mandrels 18a are then removed, leaving the spacers 22a in the cell array region 101 intact. The spacers 22a have a second pitch $P_2$. According to an embodiment of the invention, the second pitch $P_2$ is half of the first pitch $P_1$. For example, the step of removing the mandrels 18a may utilize an etching gas containing oxygen plasma, but not limited thereto.

Figure 6:
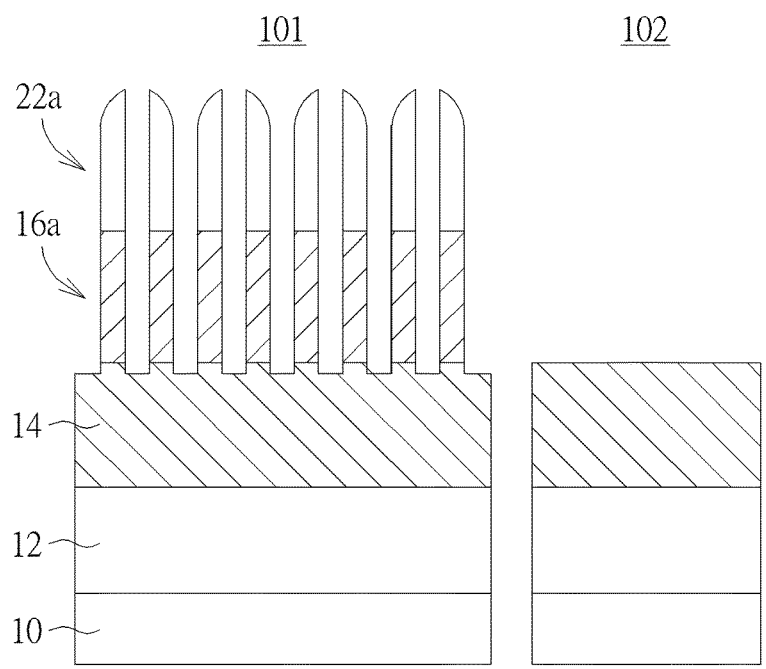

As shown in FIG. 6, the spacers 22a are used as an etching mask, and the second hard mask layer 16 in the cell array region 101 and the second hard mask 16 in the peripheral region 102 are anisotropically etched so as to transfers the pattern of the spacers 22a to the second hard mask layer 16 underneath. Thus, a patterned second hard mask layer 16a is formed in the cell array region 101. For example, the step of anisotropically etching the second hard mask layer 16 in the cell array region 101 and the second hard mask layer 16 in the peripheral region 102 may be performed by using etching gas containing oxygen and $Cl_2$ or HBr.

As can be seen from FIG. 5 to FIG. 6, when the second hard mask layer 16 in the cell array region 101 is anisotropically etched, the second hard mask layer 16 in the peripheral region 102 is not covered or masked.

Figure 7:
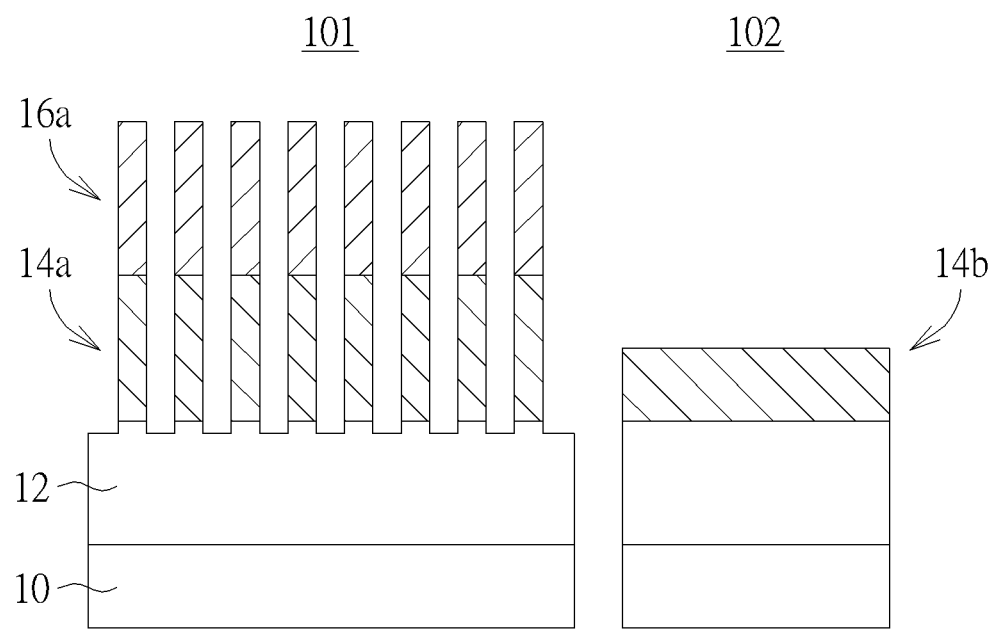

As shown in FIG. 7, the patterned second hard mask layer 16a is used as an etching hard mask, and the first hard mask layer 14 in the cell array region 101 and the first hard mask layer 14 in the peripheral region 102 are anisotropic etched, so that a patterned first hard mask layer 14a is formed in the cell array region 101. For example, the step of anisotropically etching the first hard mask layer 14 in the cell area region 101 and the first hard mask layer 14 in the peripheral region 102 may utilize an etching gas containing $C_xF_y$ and $C_xH_yF_z$. For example, $C_xF_y$ may be $C_4F_8$ or $C_4F_6$, and $C_xH_yF_z$ may be $CH_2F_2$ or $CHF_3$.

It can be seen from FIG. 6 to FIG. 7 that when the first hard mask layer 14 in the cell array region 101 is anisotropically etched, the first hard mask layer 14 in the peripheral region 102 is not covered or masked. According to an embodiment of the present invention, at this point, the patterned first hard mask layer 14a formed in the cell array region 101 partially exposes a top surface of the base layer 12, and the peripheral region 102 is covered by the remaining first hard mask layer 14b.

Finally, another anisotropic dry etching process may be performed. Using the patterned first hard mask layer 14a as an etching mask, the patterned first hard mask layer 14a is transferred to the base layer 12 in the cell array region 101.

One advantage of the present invention is that the first hard mask layer 14 in the peripheral region 102 does not need to be masked by a protective layer or a photoresist layer when the first hard mask layer 14 in the cell array region 101 is anisotropically etched, by taking advantage of the etching loading effect due to different pattern densities in the memory cell region and the peripheral region. Therefore, a photo mask can be spared.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A patterning method, comprising:
providing a substrate having thereon a base layer, a first hard mask layer on the base layer, a second hard mask layer, and a mandrel-forming layer on the second hard mask layer;
performing a lithographic and etching process to pattern the mandrel forming layer into mandrels with a first pitch on the second hard mask layer within a cell array region and to remove the mandrel-forming layer from a peripheral region;
depositing a spacer material layer on the mandrels within the cell array region and on the second hard mask layer within the peripheral region;
anisotropically etching the spacer material layer thereby forming a plurality of spacers on sidewalls of the mandrels;
removing the mandrels, leaving the plurality of spacers with a second pitch intact on the second hard mask layer within the cell array region;
using the plurality of spacers as an etching hard mask, anisotropically etching the second hard mask layer within the cell array region and the second hard mask layer within the peripheral region, thereby forming a patterned second hard mask layer within the cell array region; and
using the patterned second hard mask layer as an etching hard mask, anisotropically etching the first hard mask layer within the cell array region and the first hard mask layer within the peripheral region, thereby forming a patterned first hard mask layer within the cell array region.

2. The patterning method according to claim 1, wherein the base layer comprises polysilicon.

3. The patterning method according to claim 1, wherein the first hard mask layer comprises silicon nitride and the second hard mask layer comprises polysilicon.

4. The patterning method according to claim 1, wherein the first hard mask layer comprises silicon carbonnitride and the second hard mask layer comprises amorphous silicon.

5. The patterning method according to claim 1, wherein the mandrel forming layer comprises an organic dielectric layer and an anti-reflection layer on the organic dielectric layer.

6. The patterning method according to claim 4, wherein the anti-reflection layer comprises silicon oxynitride.

7. The patterning method according to claim 1, wherein the second pitch is half of the first pitch.

8. The patterning method according to claim 1, wherein when anisotropically etching the second hard mask layer within the cell array region, the second hard mask layer within the peripheral region is not masked.

9. The patterning method according to claim 1, wherein when anisotropically etching the first hard mask layer within the cell array region, the first hard mask layer within the peripheral region is not masked.

10. The patterning method according to claim 1, wherein the patterned first hard mask layer within the cell array region partially exposes a top surface of the base layer, while the peripheral region is covered by a remnant of the first hard mask layer.

* * * * *